(12) United States Patent
Auburger et al.

(10) Patent No.: US 7,635,911 B2
(45) Date of Patent: Dec. 22, 2009

(54) CHIP CARRIER AND SYSTEM INCLUDING A CHIP CARRIER AND SEMICONDUCTOR CHIPS

(75) Inventors: Albert Auburger, Regenstauf (DE); Jochen Dangelmaier, Beratzhausen (DE); Volker Geungerich, Regensburg (DE); Bernd Stadler, Donaustauf (DE)

(73) Assignee: Infineon Technologies AG, Neubiberg (DE)

( * ) Notice: Subject to any disclaimer, the term of this patent is extended or adjusted under 35 U.S.C. 154(b) by 386 days.

(21) Appl. No.: 11/358,716

(22) Filed: Feb. 22, 2006

(65) Prior Publication Data

US 2006/0192296 A1 Aug. 31, 2006

(30) Foreign Application Priority Data

Feb. 23, 2005 (DE) .................... 10 2005 008 600

(51) Int. Cl.
*H01L 23/495* (2006.01)

(52) U.S. Cl. ..................... 257/675; 257/676; 257/677

(58) Field of Classification Search ......... 257/675–676, 257/699–708, E23.051
See application file for complete search history.

(56) References Cited

U.S. PATENT DOCUMENTS

| 6,153,928 | A | 11/2000 | Cho |
| 6,380,613 | B1 | 4/2002 | Shen |
| 7,235,877 | B2 * | 6/2007 | Pavier .................... 257/708 |
| 2002/0140071 | A1 * | 10/2002 | Leighton et al. ............ 257/678 |
| 2004/0214373 | A1 * | 10/2004 | Jiang et al. ................ 438/110 |

FOREIGN PATENT DOCUMENTS

DE 39 22 485 C1 6/1990

* cited by examiner

*Primary Examiner*—Cuong Q Nguyen
(74) *Attorney, Agent, or Firm*—Edell, Shapiro & Finnan, LLC

(57) ABSTRACT

A chip carrier includes a first surface and a second surface that opposes the first surface. The chip carrier acts as a heat sink for semiconductor chips arranged on it. A first recess is provided in the first surface, and a second recess is provided in the second surface. First and second semiconductor chips are respectively received in the first and second recesses.

24 Claims, 2 Drawing Sheets

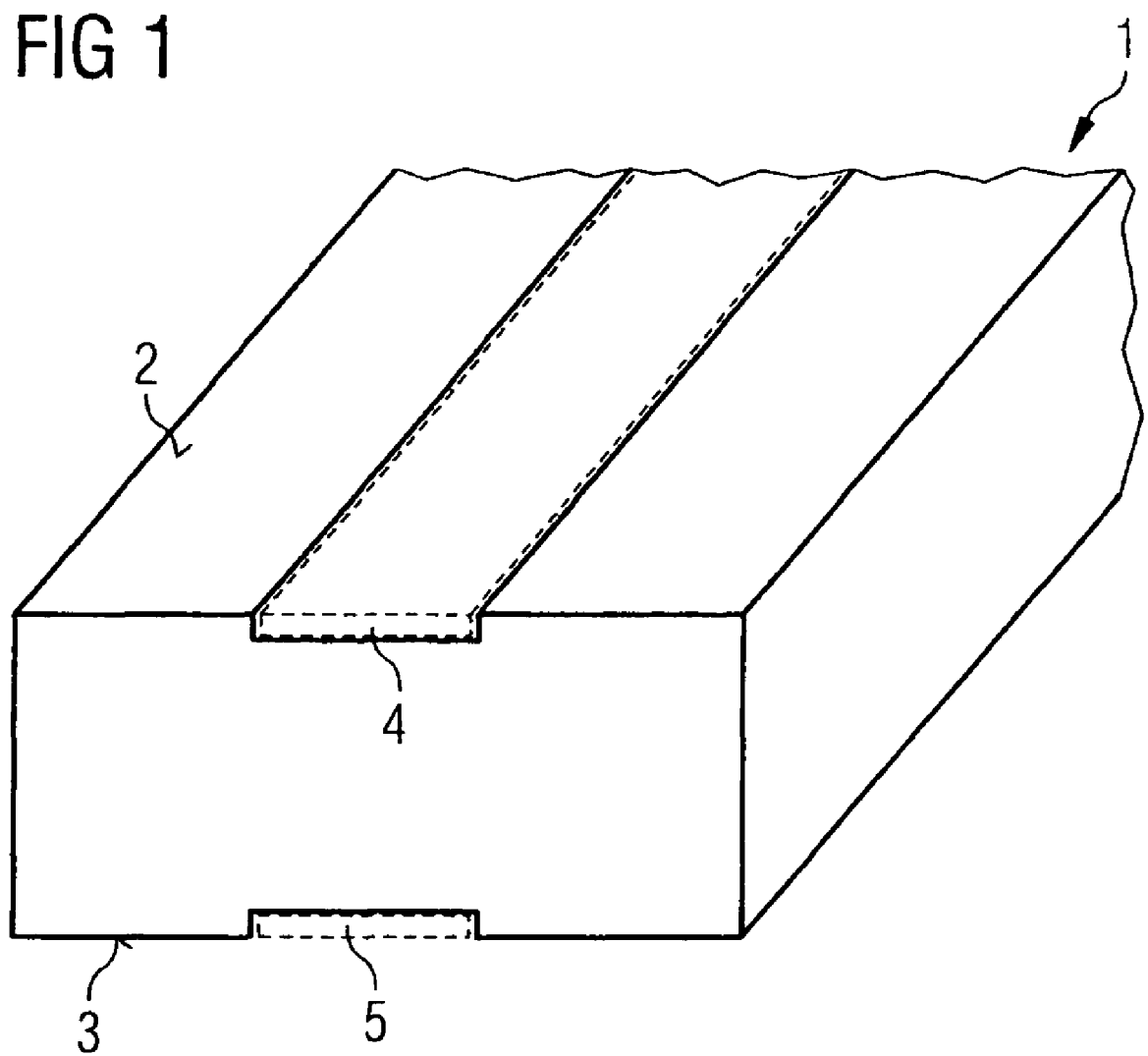

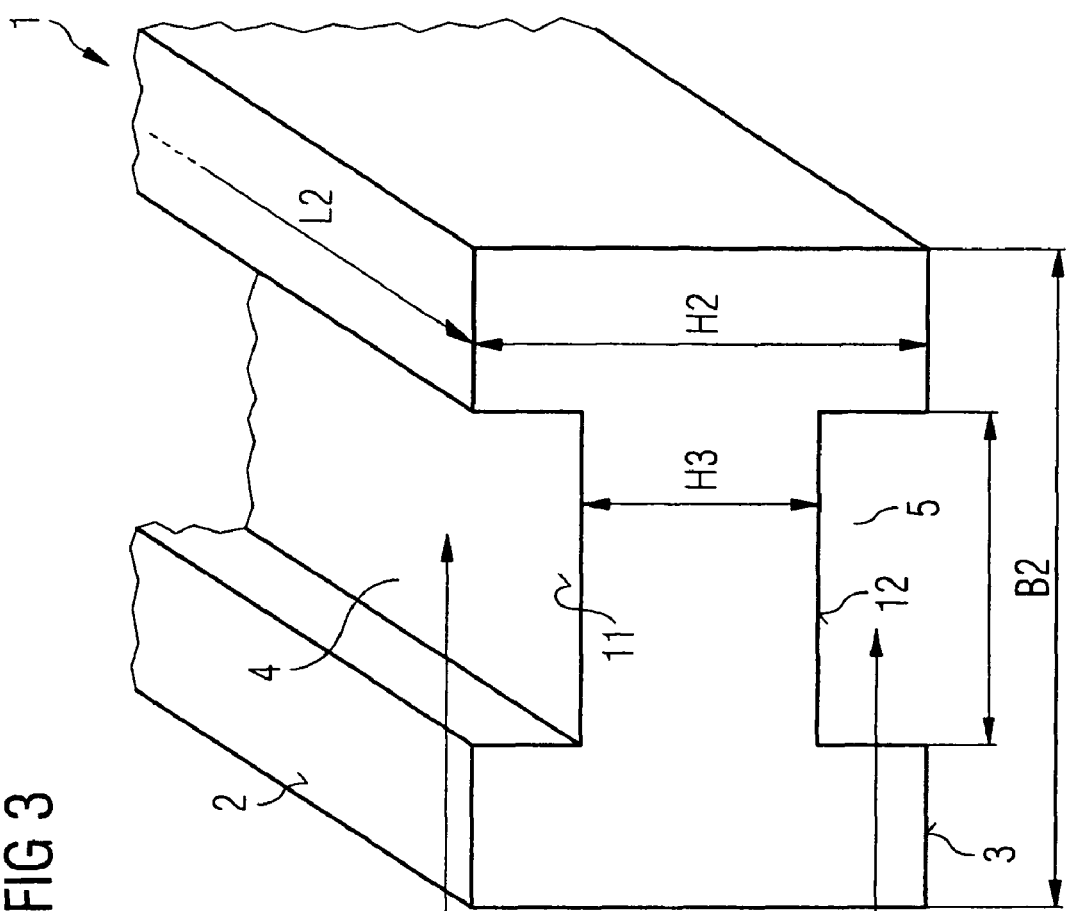
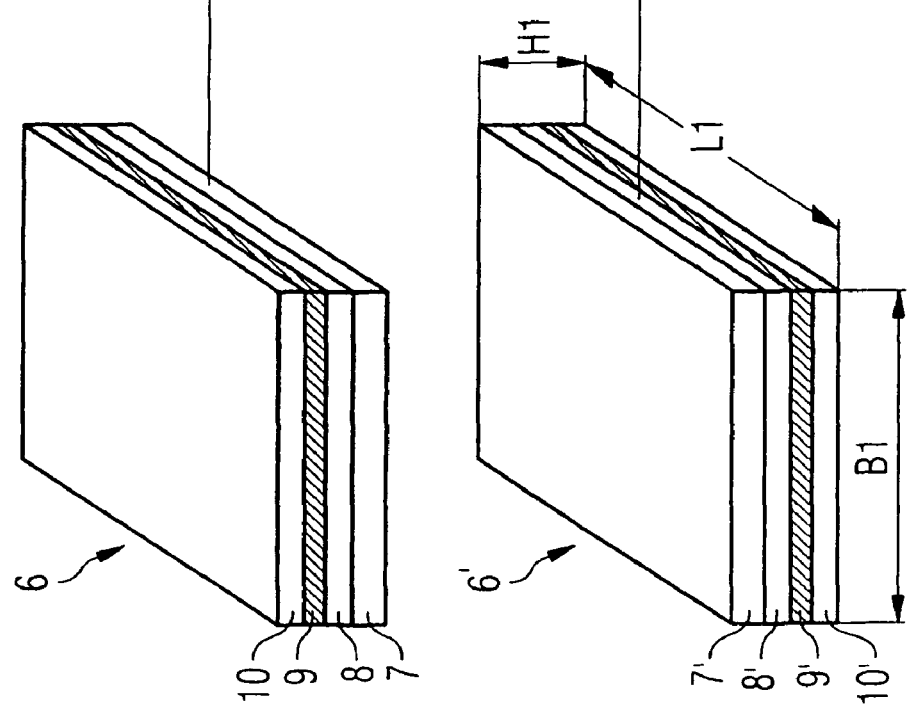

CHIP CARRIER AND SYSTEM INCLUDING A CHIP CARRIER AND SEMICONDUCTOR CHIPS

CROSS REFERENCE TO RELATED APPLICATIONS

This application claims priority under 35 USC §119 to German Application No. DE 10 2005 008 600.4, filed on Feb. 23, 2005, and titled "Chip Carrier, System Comprising a Chip Carrier and Semiconductor Chips and Method for Producing a Chip Carrier," the entire contents of which are hereby incorporated by reference.

FIELD OF THE INVENTION

The present invention relates to a chip carrier, a system including a chip carrier and semiconductor chips, and also a method for producing a chip carrier, which acts as a heat sink for semiconductor chips arranged on it.

BACKGROUND

When mounting semiconductor chips on metallic carriers, the components are exposed to high process temperatures and subsequent cooling, so that mechanical stresses occur due to the different coefficients of thermal expansion of the semiconductor chips, which are produced for example from Si, and the metal carrier, which is produced for example from Cu. These mechanical stresses can in turn lead to chip rupture, poor thermal coupling or bending.

The aforementioned problem has previously been addressed by using sintered CuW flanges or rolled multilayer carrier materials of CuCu—MoCu, thermomechanically adapted to silicon, with the intention of thereby minimizing chip ruptures and bending. These have a lower thermal conductivity than copper (for example with a tungsten content of 90%) and are expensive to produce. In the case of these materials, the depressions in the chip mounting region in the chip carrier are produced on the surface on one side.

SUMMARY OF THE INVENTION

The present invention provides a chip carrier and also a system comprising a chip carrier and semiconductor chips and a method for their production, it being possible for the chip carriers and the system to be produced at low cost and for chip ruptures to be reliably avoided.

In accordance with the present invention, a chip carrier includes a first surface and a second surface that opposes the first surface, where the chip carrier acts as a heat sink for semiconductor chips arranged on it. A respective first and second recess are provided in the first and second surfaces of the chip carrier, in which recesses a respective first and second semiconductor chip can be accomodated. The first and second recesses in the first and second surfaces of the chip carrier render it possible for a semiconductor chip to be mounted on the chip carrier not just on one side, as is conventional in the art, but on both sides. When respective semiconductor chips are mounted mirror-symmetrically in both recesses in accordance with the invention, the stresses on the first and second surfaces, i.e. on the upper side and underside of the chip carrier, cancel one another out, so that bending of the construction when there is a change in temperature, which for example during chip mounting may be up to 450° C., does not occur at all or is at least greatly diminished, and consequently chip rupture or delamination of the semiconductor chip is also prevented or at least greatly reduced.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 1 depicts a view in perspective of a portion of a chip carrier according to the invention.

FIG. 2 depicts a view in perspective of series of layers.

FIG. 3 depicts a view in perspective of a portion of another chip carrier according to the invention.

DETAILED DESCRIPTION

A chip carrier of the present invention includes a first surface and a second surface that opposes the first surface, where the chip carrier acts as a heat sink for semiconductor chips arranged on it. A respective first and second recess are provided in the first and second surfaces of the chip carrier, in which recesses a respective first and second semiconductor chip can be accomodated. The first and second recesses in the first and second surfaces of the chip carrier render it possible for a semiconductor chip to be mounted on the chip carrier not just on one side, as is conventional in the art, but on both sides. When respective semiconductor chips are mounted mirror-symmetrically in both recesses in accordance with the invention, the stresses on the first and second surfaces, i.e. on the upper side and underside of the chip carrier, cancel one another out, so that bending of the construction when there is a change in temperature, which for example during chip mounting may be up to 450° C., does not occur at all or is at least greatly diminished, and consequently chip rupture or delamination of the semiconductor chip is also prevented or at least greatly reduced.

The first and second recesses are preferably formed with the same dimensioning. It is particularly preferred for the first and second recesses to be provided mirror-symmetrically in relation to a center axis of the chip carrier. The mechanical stress vectors due to different coefficients of expansion of the material of the chip carrier and the material of the semiconductor chip are of the same magnitude, but phase-shifted by 180°, on the upper and lower interfaces between the chip carrier and the semiconductor chip and in the materials themselves. With correct dimensioning, the thermomechanical stresses and forces of the first and second surfaces or of the upper side and underside cancel one another out, whereby chip rupture and delamination are avoided.

In a preferred embodiment of the invention, the first and second recesses are in each case formed as a trench. According to another preferred embodiment of the invention, the first and second recesses are in each case formed such that they are larger than the first and second semiconductor chips that can be respectively accomodated in them, whereby the cooling capacity of the chip carrier acting as a heat sink is increased.

The chip carrier is preferably constructed of a metallic material, in particular from Cu, CuMo, CuZr, Fe—Cu, SF—Cu, K80 or K75.

It is further preferred that the first and second recesses have a respective first and second bottom area, on which an electrodeposited series of layers of NiNiP, Cu/Ag, Ni/Ag, Ni/Au, Ni/Cr/Au or Ni/Pt/Au is provided, with Ni being deposited on the respective first and second bottom areas of the first and second recesses and NiP, Ag or Au forming the surface with respect to a back side of the first and second semiconductor chips that can respectively be accomodated in the first and second recesses. Therefore, the first and second bottom areas of the first and second recesses form a surface which is prepared for a soldered connection with a semiconductor chip that can be mounted in the recess.

The roughness of the surface of the series of layers with respect to the back side of the first and second semiconductor chips that can respectively be accomodated in the first and second recesses should preferably be greater than 0.4 (i.e., Ra>0.4), in order to ensure void-free chip mounting.

According to yet another preferred embodiment of the invention, the individual layers of the series of layers are between 0.05 μm and 50 μm thick. Depending on the modulus of elasticity and on the respective material hardnesses, further mechanical stress relief between the material of the semiconductor and the chip carrier acting as a heat sink is achieved when there is a change in temperature.

A system is also provided in accordance with the invention that comprises a chip carrier and semiconductor chips, the chip carrier including a first surface and a second surface, lying opposite from the first surface, and the chip carrier acting as a heat sink for semiconductor chips arranged on it, a respective first and second recess being provided in the first and second surfaces of the chip carrier, in which recesses respective first and second semiconductor chips are accomodated.

The semiconductor chips being disposed on both sides of the chip carrier allows the stresses on the first and second surfaces, i.e. on the upper side and underside of the chip carrier, to cancel one another out, so that bending of the construction when there is a change in temperature, which for example during chip mounting may be up to 450° C., does not occur at all or is at least greatly diminished, and consequently chip rupture or delamination of the semiconductor chip is also prevented or at least greatly reduced.

The first and second semiconductor chips are preferably arranged mirror-symmetrically in relation to the center axis of the chip carrier acting as a heat sink. Preferably, the first and second semiconductor chips are produced from Si or GaAs. In addition, the first and second semiconductor chips preferably have the same dimensions, in particular the same mechanical dimensions.

According to a further preferred embodiment of the invention, the first and second semiconductor chips are RF power packages with high power losses of up to 180 W for use, inter alia, in mobile radio base stations with a service life of 20 years. In particular, silicon LDMOS amplifier chips are used, with chip thicknesses which lie between 50 μm and 140 μm and chip areas which lie between 3 mm$^2$ and 30 mm$^2$ and edge ratios of for example 5:1.

According to yet another preferred embodiment of the invention, the system includes respectively between the first and second semiconductor chip and the chip carrier a soldered connection, which includes eutectic AuSi, AuSn, PbSn or PbAgSn compounds. According to another preferred embodiment of the invention, the system includes respectively between the first and second semiconductor chip and the chip carrier an adhesive bond, which includes thermally conducting epoxy resins with conductivities of from 10 W/mK to 60 W/mK.

Preferably, the first and second recesses are formed with the same dimensioning. It is even more preferred for the first and second recesses to be provided mirror-symmetrically in relation to a center axis of the chip carrier. By being formed in this way, the thermomechanical stresses and forces cancel one another out, so that chip rupture and delamination are prevented or reduced.

The first and second recesses preferably are in each case formed as a trench. Furthermore, the first and second recesses should in each case be formed such that they are larger than the first and second semiconductor chips that can be respectively accomodated in them, so that an even better cooling effect of the chip carrier acting as a heat sink is achieved.

Preferred materials for constructing the chip carrier are metallic materials such as Cu, CuMo, CuZr, Fe—Cu, SF—Cu, K80 or K75.

According to a further preferred embodiment of the invention, the first and second recesses include a respective first and second bottom area, on which an electrodeposited series of layers of NiNiP, Cu/Ag, Ni/Ag, Ni/Au, Ni/Cr/Au or Ni/Pt/Au is provided, with Ni being deposited on the respective first and second bottom areas of the first and second recesses and NiP, Ag or Au forming the surface with respect to a back side of the first and second semiconductor chips that can respectively be accomodated in the first and second recesses. Therefore, the bottom areas of the first and second recesses form ready-prepared areas on which the semiconductor chips can be soldered.

The roughness of the surface of the series of layers with respect to the back side of the first and second semiconductor chips that can respectively be accomodated in the first and second recesses should preferably be greater than 0.4 (i.e., Ra>0.4), in order to ensure void-free chip mounting.

If the individual layers of the series of layers are between 0.05 μm and 50 μm thick, then, depending on the modulus of elasticity and the material hardnesses, further mechanical stress relief between the semiconductor and the heat sink or the chip carrier can be achieved when there is a change in temperature.

In addition, a method for producing a chip carrier, which acts as a heat sink for semiconductor chips, is provided in accordance with the invention. The chip carrier inclujdes a first surface and a second surface, lying opposite from the first surface, respective first and second recesses being provided in the first surface and in the second surface, the recesses being adapted in such a way as to receive first and second semiconductor chips in them. By being produced in this way, with the effect that the mounting of semiconductor chips on both sides is made possible and chip rupture and delamination of the semiconductor chips are prevented or reduced by stress equalization, high-quality chip carriers can be produced in a simple and consequently low-cost manner.

It is particularly preferred to provicde the first and second recesses with the same dimensions, the first and second recesses being provided mirror-symmetrically in relation to a center axis of the chip carrier. The first and second recesses are in each case formed as a trench. It is further preferred to provide the first and second recesses such that they are larger than the first and second semiconductor chips that are respectively to be accomodated in them.

According to a further preferred embodiment of the invention, metallic materials, in particular Cu, CuMo, CuZr, Fe—Cu, SF—Cu, K80 or K75, are used to form the chip carrier.

According to yet another preferred embodiment of the invention, the first and second recesses are formed with a respective first and second bottom area, on which a series of layers of NiNiP, Cu/Ag, Ni/Au, Ni/Cr/Au or Ni/Pt/Au is electrodeposited, with Ni being deposited on the respective first and second bottom areas of the first and second recesses and NiP, Ag or Au forming the surface with respect to a back side of the first and second semiconductor chips that are respectively to be accomodated in the first and second recesses.

The individual layers of the series of layers are preferably provided in a thickness of from 0.05 µm to 50 µm.

The semiconductor chips may be soldered onto the respective first and second bottom area of the first and second recesses, eutectic AuSi, AuSn or soft solders with high-lead-content PbSn or PbAgSn compounds being used as the soldered connection. AuSi or AuSn layers in a eutectic ratio are deposited on a respective back side of the first and second semiconductor chips.

In another preferred embodiment of the invention, PbSn or PbAgSn compounds are deposited on the respective first and second bottom area of the first and second recesses by soldering wires. AuSn or PbSn preforms or solder pastes with the volume ratios corresponding to the eutectic material composition are used.

Alternatively, the first and second semiconductor chips may also be adhesively attached onto the respective first and second bottom area of the first and second recesses. Highly thermally conductive epoxy resins with conductivities of from 10 W/mK to 60 W/mK, the maximum curing process temperatures of which lie around 200° C., are preferably used as the adhesive bond.

Furthermore, a particularly preferred embodiment of the invention provides that the first and second semiconductor chips are provided mirror-symmetrically in relation to a center axis of the chip carrier acting as a heat sink, so that it is ensured that thermomechanical stresses and forces cancel one another out and chip rupture and delamination of the semiconductor chips are avoided or reduced.

The first and second semiconductor chips are preferably produced from Si or GaAs.

It is preferable for the first and second semiconductor chips to be produced with the same dimensioning, in particular with the same mechanical dimensions.

According to yet another preferred embodiment, the first and second semiconductor chips are produced with a thickness of between 50 µm and 140 µm and a chip area of between 3 mm² and 30 mm² with edge ratios of 5:1.

Exemplary embodiments of the present invention are now described below with reference to FIGS. 1-3.

FIG. 1 shows a perspective oblique view of a chip carrier 1 according to the invention. The chip carrier 1 is produced from copper and acts as a heat sink for semiconductor chips mounted on it, the mounting position of which is indicated by the dashed lines. The chip carrier 1 includes a first surface 2 and a second surface 3 that lies opposite from the first surface 1. In the first surface 2, a first recess 4 is provided in the form of a trench. Mirror-symmetrical in relation to the first recess 4 in the first surface 2, a second recess 5 is provided in the second surface 3, likewise in the form of a trench. Semiconductor chips can be mounted in the opposite, equally dimensioned trenches, for example by adhesive bonding or soldering.

In FIG. 2, two series of layers 6, 6', which are identical but turned by 180° or reflected about a plane of symmetry, are represented, as they can be electrodeposited on the chip carrier 1 or in the first recess 4 and the second recess 5 (see FIG. 3). The series of layers 6, 6' include altogether four individual layers 7, 7', 8, 8', 9, 9' and 10, 10'. The layers 10, 10' identify a first semiconductor chip 10 and a second semiconductor chip 10'. Each series of layers 6, 6' has a length L1 of 5.85 mm, a width B1 of 1.2 mm and a height H1 of 75 µm. Each first layer 7, 7', which is respectively deposited directly in the chip mounting region of the chip carrier 1, is 10 µm thick and consists of nickel (Ni). Over it there is in each case a 3 µm thick second layer 8, 8' of silver (Ag). The thickness of the first layer 7, 7' may vary between 10 µm and 30 µm and the thickness of the second layer 8, 8' may vary between 3 µm and 6 µm. As an alternative to the materials mentioned, the following materials may also be used for the first layer 7, 7' and the second layer 8, 8': NiNiP, Cu/Ag, Ni/Ag, Ni/Au, Ni/Cr/Au, Ni/Pt/Au, with Ni being deposited directly on the chip carrier 1 and respectively forming the first layer 7, 7', and NiP, Ag, Au forming the surface with respect to the back side of the chip and consequently respectively forming the second layer 8, 8'. The roughness of these surfaces should lie in the range of better or greater than Ra=0.4 (e.g., Ra>0.4), in order to ensure void-free chip mounting. Each third layer 9, 9' is a eutectic AuSi, which is located over the second layer 8, 8' in a thickness of 1 µm and forms the soldered connection with respect to the first and second semiconductor chips 10, 10', which are deposited as a fourth layer in a thickness of 60 µm and consisting of silicon (Si). For the soldered connection, i.e., as the third layer 9, 9', it is also possible to use AuSn or soft solders with high-lead-content PbSn or PbAgSn compounds. In this case, for AuSi or AuSn, corresponding Au and Sn layers are deposited on the back side of the wafer in the eutectic volume ratio. PbSn or PbAgSn is deposited by solder wires on the heat sink, i.e. on the chip carrier 1.

Alternatively, in the case of AuSn or PbSn, preforms (i.e., thin solder platelets) or solder pastes with the volume ratios corresponding to the eutectic material composition may be used. These are placed or dispensed on the chip carrier 1 on a cold station of the die bonder. During the chip mounting, the chip carrier 1 and the semiconductor chip go through process temperatures of about 450° C. (AuSi), 400° C. (AuSn) or 300° C. (PbSn) to room temperature. As an alternative to a soldered connection of the chip carrier 1 with a semiconductor chip, an adhesive bond may be produced by highly thermally conductive epoxy resins with conductivities of from 10 W/mK to 60 W/mK. In this case, the maximum curing process temperatures are approximately 200° C.

FIG. 3 shows a further perspective oblique view of the chip carrier 1 according to the invention, in which the series of layers 6, 6' represented in FIG. 2 can be accommodated, so as to form a 100 W RF power package with a Cu heat sink. The chip carrier 1 is in turn produced completely from copper and has a first surface 2 with a first recess 4 and an opposite second surface 3 with a second recess 5. Furthermore, the chip carrier 1 has a length L2 of 15.75 mm, a width B2 of 9.78 mm and a height H2 of 1.14 mm. The first recess 4 in the first surface 2 of the chip carrier 1 has a first bottom area 11, on which a first semiconductor chip 10 or the series of layers 6 can be mounted, the first layer 7 of the series of layers 6 being in direct contact with the first bottom area 11. The respective dimensions of the first and second recesses 4, 5 are as follows: height 60 µm, width 1.7 mm and length 15.75 mm. Consequently, the first and second recesses 4, 5 are dimensioned to be greater in their length and width than the first and second semiconductor chips 10, 10', which respectively have a length of 5.85 mm and a width of 1.2 mm. The distance H3 between the first bottom area 11 and the second bottom area 12 is 1.02 mm. The distance H3 can be varied between 1.02 mm and 0.72 mm. The second recess 5 in the second surface 3 of the chip carrier 1 has a second bottom area 12, on which a second semiconductor chip 10' or the series of layers 6' can be mounted, the first layer 7' of the series of layers 6' being in direct contact with the second bottom area 12.

When the two identical semiconductor chips 10, 10' are mounted mirror-symmetrically in the respective first and second recesses 4, 5, the mechanical stress vectors due to different coefficients of expansion of silicon and copper are of the same magnitude, but phase-shifted by 180°, on the upper and lower (or first and second) interfaces between copper and silicon and in the materials themselves. The stresses on the upper side and underside or on the first surface 2 and the second surface 3 consequently cancel one another out and bending of the construction when there is a change in temperature is avoided.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A chip carrier comprising a first surface and a second surface that opposes the first surface, a first recess provided in the first surface and a second recess provided in the second surface, wherein the chip carrier is configured to provide a heat sink for semiconductor chips arranged on the chip carrier, the first and second recesses are suitably dimensioned to receive first and second semiconductor chips, and each of the first and second recesses comprises a bottom area on which an electrodeposited series of layers of one of NiNiP, Cu/Ag, Ni/Ag, Ni/Au, Ni/Cr/Au and Ni/Pt/Au is provided, with Ni being deposited on each bottom area and one of NiP, Ag and Au forming a surface that faces a back side of one of the first and second semiconductor chips that is placed within a corresponding one of the first and second recesses.

2. The chip carrier of claim 1, wherein the first and second recesses have the same dimensions.

3. The chip carrier of claim 1, wherein the first and second recesses are disposed in the first and second surfaces mirror-symmetrically in relation to a center axis of the chip carrier.

4. The chip carrier of claim 1, wherein each of the first and second recesses is formed as a trench.

5. The chip carrier of claim 1, wherein the dimensions of each of the first and second recesses are larger than the first and second semiconductor chips to be received within the first and second recesses.

6. The chip carrier of claim 1, wherein the chip carrier comprises a metallic material selected from the group consisting of Cu, CuMo, CuZr, Fe—Cu, SF—Cu, K80 and K75.

7. The chip carrier of claim 1, wherein the roughness of the surface of the series of layers with respect to the back side of each of the first and second semiconductor chips that are received in the first and second recesses has a value greater than Ra=0.4.

8. The chip carrier of claim 1, wherein each individual layer of the series of layers has a thickness in the range of about 0.05 μm to about 50 μm.

9. A system comprising a chip carrier and first and second semiconductor chips supported by the chip carrier, the chip carrier comprising a first surface and a second surface that opposes the first surface, a first recess provided in the first surface and a second recess provided in the second surface, wherein the first semiconductor chip is received within the first recess, the second semiconductor chip is received within the second recess, the chip carrier is configured to provide a heat sink for the semiconductor chips supported by the chip carrier, and the first recess comprises a first bottom area and the second recess comprises a second bottom area, the first and second bottom areas including an electrodeposited series of layers of one of NiNiP, Cu/Ag, Ni/Ag, Ni/Au, Ni/Cr/Au and Ni/Pt/Au, with Ni being deposited on each of the first and second bottom areas and one of NiP, Ag and Au forming a surface that faces a back side of the first and second semiconductor chips that are received within the first and second recesses.

10. The system of claim 9, wherein the first and second semiconductor chips are arranged mirror-symmetrically in relation to a center axis of the chip carrier.

11. The system of claim 9, wherein the first and second semiconductor chips are formed from Si or GaAs.

12. The system of claim 10, wherein the first and second semiconductor chips have the same dimensions.

13. The system of claim 9, wherein the first and second semiconductor chips comprise silicon LDMOS amplifier chips.

14. The system of claim 9, wherein each of the first and second semiconductor chips has a thickness in the range of about 50 μm to about 140 μm.

15. The system of claim 9, wherein each of the first and second semiconductor chips has a chip area in the range of about 3 mm$^2$ to about 30 mm$^2$, and an edge ratio of 5:1.

16. The system of claim 9, further comprising a soldered connection between each of the first and second semiconductor chips and the chip carrier, each soldered connection comprising eutectic AuSi, AuSn, PbSn or PbAgSn compounds.

17. The system of claim 9, further comprising an adhesive bond between each of the first and second semiconductor chips and the chip carrier, each adhesive bond comprising a thermally conducting epoxy resin with a conductivity of from 10 W/mK to 60 W/mK.

18. The system of claim 9, wherein the first and second recesses have the same dimensions.

19. The system of claim 9, wherein the first and second recesses are provided minor-symmetrically in relation to a center axis of the chip carrier.

20. The system of claim 9, wherein each of the first and second recesses is formed as a trench.

21. The system of claim 9, wherein the first and second recesses are formed such that they are larger than the first and second semiconductor chips that are received within the first and second recesses.

22. The system of claim 9, wherein the chip carrier comprises a metallic material selected from the group consisting of Cu, CuMo, CuZr, Fe—Cu, SF—Cu, K80 and K75.

23. The system of claim 9 wherein a roughness of the surfaces of the series of layers that face the back sides of the first and second semiconductor chips has a value greater than Ra=0.4.

24. The system of claim 9, wherein each series of layers includes individual layers having thicknesses from about 0.05 μm to about 50 μm.

* * * * *

UNITED STATES PATENT AND TRADEMARK OFFICE
CERTIFICATE OF CORRECTION

| | | |
|---|---|---|
| PATENT NO. | : 7,635,911 B2 | Page 1 of 1 |
| APPLICATION NO. | : 11/358716 | |
| DATED | : December 22, 2009 | |
| INVENTOR(S) | : Albert Auburger et al. | |

It is certified that error appears in the above-identified patent and that said Letters Patent is hereby corrected as shown below:

On the front page of the patent, in section (75) Inventors:, replace the third inventor's name "Volker Geungerich" with -- Volker Guengerich --.

Signed and Sealed this
Twenty-second Day of March, 2011

David J. Kappos
*Director of the United States Patent and Trademark Office*